(12) United States Patent
Cho et al.

(10) Patent No.: US 7,977,979 B2
(45) Date of Patent: Jul. 12, 2011

(54) HIGH-SPEED MULTI-STAGE VOLTAGE COMPARATOR

(75) Inventors: Young Kyun Cho, Daejeon (KR); Young Deuk Jeon, Daejeon (KR); Jae Won Nam, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 43 days.

(21) Appl. No.: 12/507,357

(22) Filed: Jul. 22, 2009

(65) Prior Publication Data

US 2010/0156469 A1    Jun. 24, 2010

(30) Foreign Application Priority Data

Dec. 22, 2008  (KR) .................. 10-2008-0131613

(51) Int. Cl.
*H03K 5/22* (2006.01)
(52) U.S. Cl. .......................... 327/63; 327/65
(58) Field of Classification Search .................. None
See application file for complete search history.

(56) References Cited

U.S. PATENT DOCUMENTS

| | | | | |
|---|---|---|---|---|
| 4,611,130 A * | 9/1986 | Swanson | ........................ | 327/65 |
| 4,707,624 A | 11/1987 | Yee | | |
| 4,883,987 A * | 11/1989 | Fattaruso | ........................ | 327/65 |
| 5,032,744 A | 7/1991 | Wai Yeung Liu | | |
| 5,065,045 A | 11/1991 | Mok | | |
| 5,113,090 A | 5/1992 | Imaizumi et al. | | |
| 5,272,395 A * | 12/1993 | Vincelette | ........................ | 327/63 |
| 5,311,085 A | 5/1994 | Pelgrom et al. | | |
| 5,600,275 A | 2/1997 | Garavan | | |
| 5,892,374 A * | 4/1999 | Fiedler | ........................ | 327/65 |
| 5,929,662 A * | 7/1999 | Alexander et al. | ............... | 327/67 |
| 6,157,220 A * | 12/2000 | Broekaert | ........................ | 327/65 |
| 6,288,666 B1 | 9/2001 | Afghahi et al. | | |
| 6,320,426 B1 * | 11/2001 | Shih | ............................... | 327/65 |
| 6,429,697 B1 | 8/2002 | Amazeen et al. | | |
| 6,762,628 B2 | 7/2004 | Ebner | | |
| 7,208,980 B2 | 4/2007 | Mulder | | |
| 7,400,279 B2 | 7/2008 | Krymski | | |
| 7,492,301 B1 * | 2/2009 | Hagleitner et al. | ........... | 341/155 |
| 2008/0048731 A1 * | 2/2008 | Huang | ............................. | 327/65 |

FOREIGN PATENT DOCUMENTS

EP           1378061 B1    6/2005
KR    1020010073292 A    8/2001

OTHER PUBLICATIONS

Behzad Razavi et al., "Design Techniques for High-Speed, High-Resolution Comparators," IEEE Journal of Solid-State Circuits, Dec. 1992, pp. 1916-1926, vol. 27. No. 12.

* cited by examiner

*Primary Examiner* — Tuan Lam

(57) ABSTRACT

A high-speed multi-stage voltage comparator is provided. The multi-stage voltage comparator is configured to eliminate offset from outputs of preamplifiers through respective offset-cancellation switches, and to reset the outputs of the preamplifiers through respective reset switches to reduce an output recovery time. Thus, the multi-stage voltage comparator operates with high accuracy and at a high speed, so that it can be usefully applied to an analog-to-digital converter (ADC), and particularly, a high-speed successive approximation register ADC (SAR ADC).

13 Claims, 6 Drawing Sheets

HIGH-SPEED MULTI-STAGE VOLTAGE COMPARATOR

CROSS-REFERENCE TO RELATED APPLICATION

This application claims priority to and the benefit of Korean Patent Application No. 10-2008-0131613, filed Dec. 22, 2008, the disclosure of which is incorporated herein by reference in its entirety.

BACKGROUND

The present invention relates to a high-speed multi-stage voltage comparator. More specifically, the present invention relates to a high-speed multi-stage voltage comparator that can operate with high accuracy and at a high speed by reset and offset-cancellation switches, both of which are connected to output terminals of respective preamplifiers.

DISCUSSION OF RELATED ART

Analog-to-digital converters (ADCs) are devices that convert an analog signal into a digital signal. The ADCs essentially employ a comparator, which compares the magnitudes of two signals to output a result.

FIG. 1 illustrates a conventional multi-stage voltage comparator 100 used for an ADC.

Referring to FIG. 1, the conventional multi-stage voltage comparator 100 has a structure in which numerous preamplifiers A11 through A13 are cascaded with a latch L for high-speed operation.

This multi-stage voltage comparator 100 can obtain relatively high speed and accuracy using advantages of the preamplifiers A11 through A13 having a small offset and the latch L having a large voltage gain.

The multi-stage voltage comparator 100 must, however, be designed in such a manner that the preamplifiers A11 through A13 can operate on the respective stages as soon as possible, because operating speed is restricted by a propagation delay time due to an input signal having to pass through several stages.

However, in the structure for eliminating offset and feedthrough as in FIG. 1, a sufficient inter-phase gap must be kept between first through fourth clocks CK1 through CK4. For this reason, there is a limit to an available clock cycle, and problems of timing skew, etc., occur, so that operating speed is reduced.

Furthermore, when the multi-stage voltage comparator 100 shown in FIG. 1 is used for a successive approximation register ADC (hereinafter, referred to as an "SAR ADC"), all of the first through fourth clocks CK1 through CK4 must operate during a sampling time $Q_{sampling}$. Thus, it is difficult for the multi-stage voltage comparator 100 to be used for the high-speed SAR ADC having the small sampling time $Q_{sampling}$ that ranges from several to tens of ns.

SUMMARY OF THE INVENTION

The present invention is directed to a multi-stage voltage comparator capable of operating with high accuracy and at a high speed.

More particularly, the present invention is directed to a multi-stage voltage comparator that eliminates offset from an output of each preamplifier to improve accuracy of comparison, and minimizes an output recovery time of each preamplifier to allow high-speed operation.

One aspect of the present invention provides a high-speed multi-stage voltage comparator including: a multi-stage amplifier having a plurality of preamplifiers cascaded on multiple stages; a latch connected to an output terminal of the multi-stage amplifier; a plurality of capacitors storing voltages output from the respective preamplifiers; a plurality of offset-cancellation switches connected to output terminals of the respective preamplifiers to eliminate offset from the outputs of the respective preamplifiers; and a plurality of reset switches connected to the output terminals of the respective preamplifiers to reset the outputs of the respective preamplifiers.

The reset and offset-cancellation switches, which are connected to the output terminals of the respective preamplifiers, may operate in response to asynchronous clocks.

The offset-cancellation switches may be simultaneously turned on for a predetermined time before input voltages are input to the respective preamplifiers to eliminate the offset from the outputs of the respective preamplifiers. Alternatively, the offset-cancellation switches may be sequentially turned on for a predetermined time before input voltages are input to the respective preamplifiers to eliminate the offset and feedthrough from the outputs of the respective preamplifiers.

Each of the offset-cancellation switches may be a small complementary metal oxide semiconductor (CMOS) switch.

The reset switches may reset the outputs of the respective preamplifiers in response to respective clocks maintaining a HIGH state until after input voltages input to the respective preamplifiers are crossed. If necessary, the reset switches may reset the outputs of the respective preamplifiers in response to one clock having a longest cycle among clocks maintaining a HIGH state until after input voltages input to the respective preamplifiers are crossed.

As the reset switches maintain an ON state until after the input voltages input to the respective preamplifiers are crossed, the respective preamplifiers may reduce a propagation delay time and an output recovery time. The respective preamplifiers may be reset for a predetermined time by the respective reset switches, and amplify and output a difference between the input voltages after the input voltages are crossed.

Using the reduction of the output recovery time, the preamplifier at a front stage in the multi-stage amplifier may have a higher operating speed than the preamplifier at a rear stage.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

The present invention will now be described more fully with reference to the accompanying drawings, in which exemplary embodiments of the invention are shown. This invention may, however, be embodied in different forms and should not be construed as limited to the exemplary embodiments set forth herein.

Figure 2:
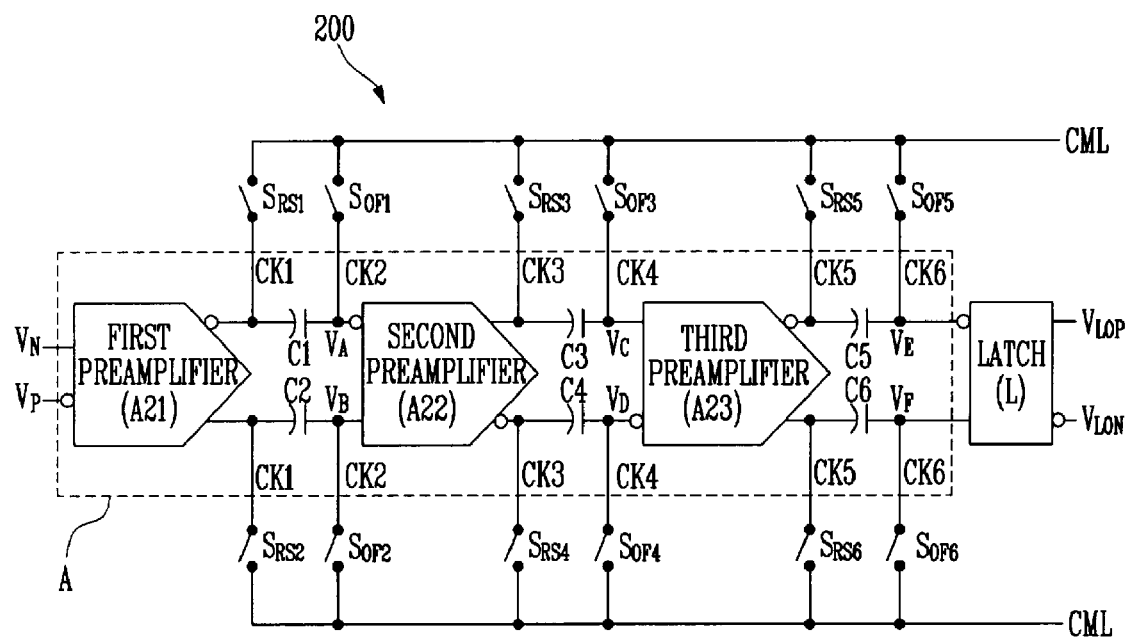
FIG. 2 is a diagram for describing a high-speed multi-stage voltage comparator according to an exemplary embodiment of the present invention.
Figure 2:
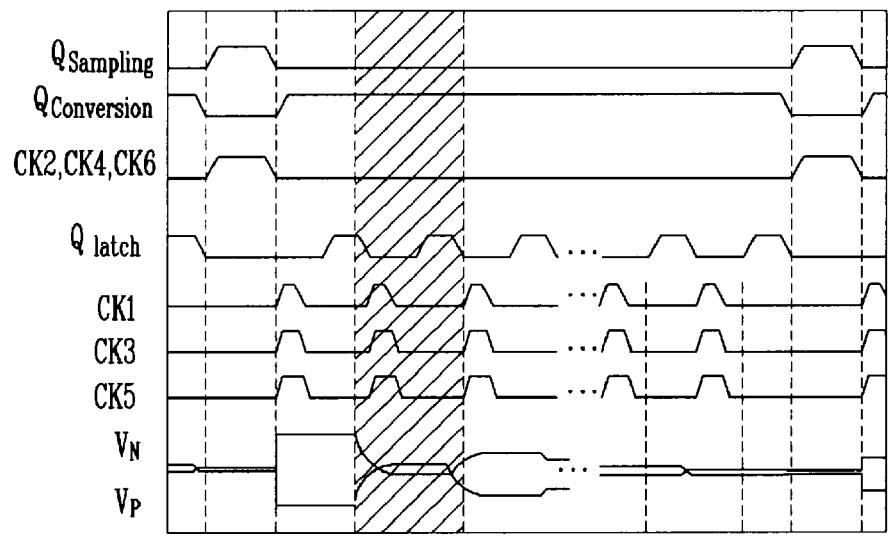

FIG. 2 is a diagram for describing a high-speed multi-stage voltage comparator 200 according to an exemplary embodiment of the present invention.

Referring to FIG. 2, the high-speed multi-stage voltage comparator 200 includes a multi-stage amplifier A having first through third preamplifiers A21 through A23 cascaded on multiple stages, a latch L connected to an output terminal of the multi-stage amplifier A, first through sixth capacitors C1 through C6 for storing electrical energy such as voltage output from the first through third preamplifiers A21 through A23, and first through sixth reset switches $S_{RS1}$ through $S_{RS6}$ and first through sixth offset-cancellation switches $S_{OF1}$ through $S_{OF6}$ connected to output terminals of the first through third preamplifiers A21 through A23.

Relationships between the components will be described below in brief.

The first and second capacitors C1 and C2 are connected between an output terminal of the first preamplifier A21 and an input terminal of the second preamplifier A22. The third and fourth capacitors C3 and C4 are connected between an output terminal of the second preamplifier A22 and an input terminal of the third preamplifier A23. The fifth and sixth capacitors C5 and C6 are connected between an output terminal of the third preamplifier A23 and an input terminal of the latch L.

The first and second capacitors C1 and C2 are connected at first ends thereof to the respective first and second reset switches $S_{RS1}$ and $S_{RS2}$ which operate in response to a first clock CK1, and at the second ends thereof to the first and second offset-cancellation switches $S_{OF1}$ and $S_{OF2}$ which operate in response to a second clock CK2. The third and fourth capacitors C3 and C4 are connected at first ends thereof to the respective third and fourth reset switches $S_{RS3}$ and $S_{RS4}$ which operate in response to a third clock CK3, and at the second ends thereof to the third and fourth offset-cancellation switches $S_{OF3}$ and $S_{OF4}$ which operate in response to a fourth clock CK4. The fifth and sixth capacitors C5 and C6 are connected at first ends thereof to the respective fifth and sixth reset switches $S_{RS5}$ and $S_{RS6}$ which operate in response to a fifth clock CK5, and at the second ends thereof to the fifth and sixth offset-cancellation switches $S_{OF5}$ and $S_{OF6}$ which operate in response to a sixth clock CK6.

For convenience, this exemplary embodiment employs a structure in which the latch L is cascaded with the multi-stage amplifier A having three stages, but it may be applied to any structure in which the latch L is cascaded with a multi-stage amplifier having two or more stages. Further, the odd-numbered reset and offset-cancellation switches $S_{RS1}$, $S_{RS3}$, $S_{RS5}$, $S_{OF1}$, $S_{OF3}$ and $S_{OF5}$ and the even-numbered reset and offset-cancellation switches $S_{RS2}$, $S_{RS4}$, $S_{RS6}$, $S_{OF2}$, $S_{OF4}$ and $S_{OF6}$ are connected to respective common mode voltage (CML) terminals, but they may be realized by shorting differential signals in groups according to operation of the circuit.

The multi-stage voltage comparator 200 has a unique feature in that it can operate at a high speed by eliminating offsets from the outputs of the preamplifiers A21 through A23 using the first through sixth offset-cancellation switches $S_{OF1}$ through $S_{OF6}$, and by minimizing output recovery times of the preamplifiers A21 through A23 using the first through sixth reset switches $S_{RS1}$ through $S_{RS6}$. This feature will be described below in greater detail.

Figure 3:
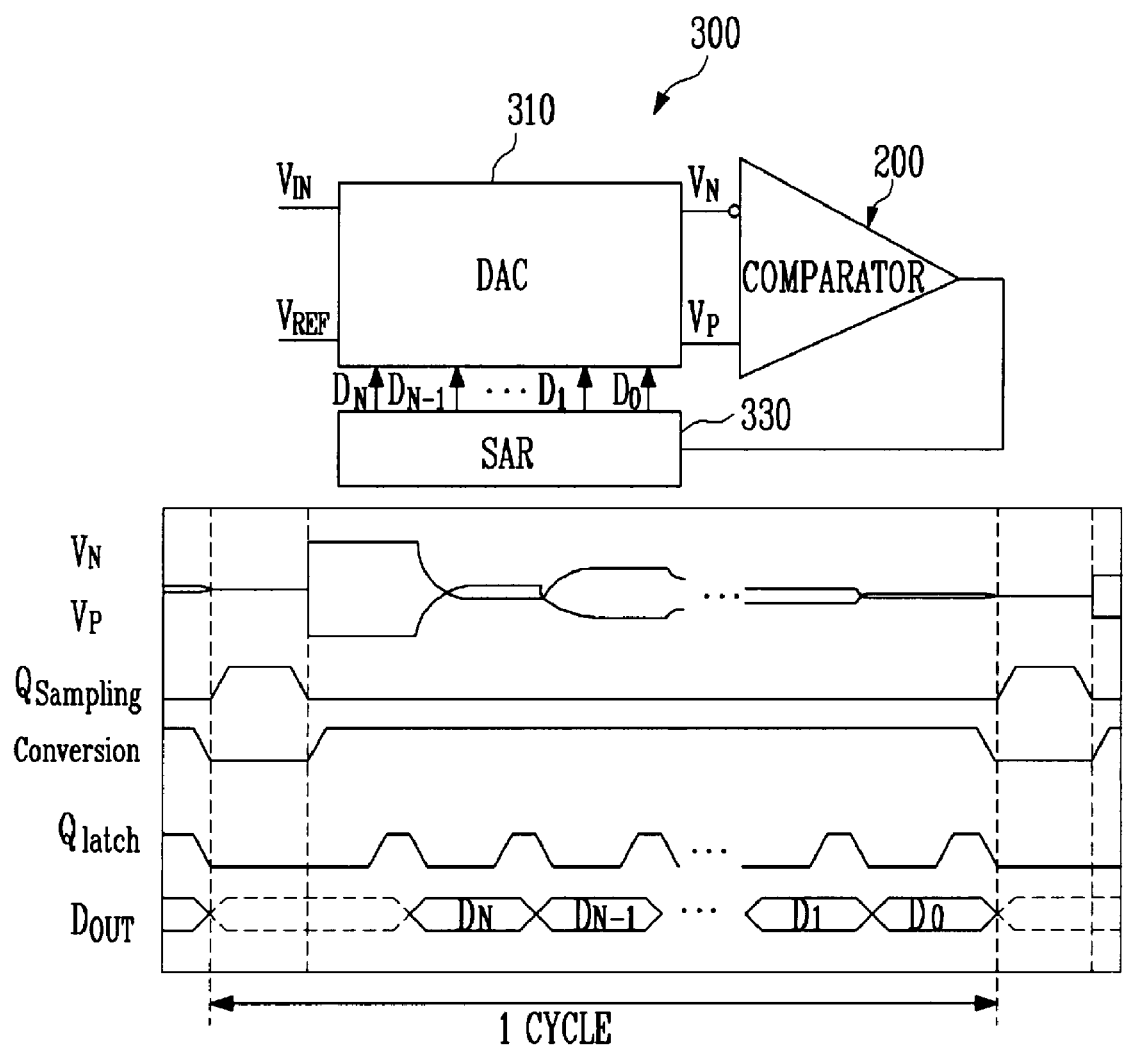
FIG. 3 illustrates a successive approximation register ADC (SAR ADC) to which a multi-stage voltage comparator according to an exemplary embodiment of the present invention is applied.

FIG. 3 illustrates a successive approximation register (SAR) analog-to-digital converter (ADC) 300 to which the multi-stage voltage comparator 200 according to an exemplary embodiment of the present invention is applied.

Referring to FIG. 3, the multi-stage voltage comparator 200 according to an exemplary embodiment of the present invention compares the magnitudes of two input voltages $V_N$ and $V_P$ input from a digital-to-analog converter (DAC) 310, and outputs high when one of the two input voltages is smaller than the other and low when the one of the two input voltages is greater than the other.

Since this operation of comparing the two input voltages $V_N$ and $V_P$ has a large influence on the accuracy of analog-to-digital conversion of the SAR ADC 300, the offset of the multi-stage voltage comparator 200 must be reduced as much as possible in order to perform accurate voltage comparison.

Furthermore, in a structure in which a recently disclosed SAR DAC having a conversion speed of tens of MS/s does not use a sample-and-hold (S/H) amplifier, the sampling time $Q_{sampling}$ is a very short time ranging from several to tens of ns. As such, in order to eliminate both the offset and the feedthrough during the very short sampling time $Q_{sampling}$, each preamplifier must operate very rapidly, or load capacitance must be very small.

Since there are practical limitations to designing a load capacitance less than a predetermined value, each preamplifier must be designed to operate very rapidly. Nevertheless, it is very difficult to enhance the operating speed of each preamplifier while each preamplifier maintains a voltage gain higher than a predetermined value.

Thus, in order to enhance the operating speed of the multi-stage voltage comparator 200, the second, fourth and sixth clocks CK2, CK4 and CK6 operate simultaneously with the sampling time $Q_{sampling}$, and the offset is eliminated using the first through sixth offset-cancellation switches $S_{OF1}$ through $S_{OF6}$.

In this manner, when the second, fourth and sixth clocks CK2, CK4 and CK6 having the same rising and falling edges operate simultaneously with the sampling time $Q_{sampling}$, a feedthrough phenomenon is not eliminated. However, when each of the first through sixth offset-cancellation switches $S_{OF1}$ through $S_{OF6}$ has a small size, the influence of the feedthrough is negligible compared to that of the offset.

In detail, since there is a trade-off between enhancing operating speed and eliminating feedthrough in multi-stage voltage comparators, the multi-stage voltage comparator 200 is adapted not to eliminate feedthrough in favor of enhancing operating speed.

If the sampling time $Q_{sampling}$ is very long, or if the multi-stage voltage comparator 200 has a sufficient speed margin, the second, fourth and sixth clocks CK2, CK4 and CK6 preferably operate in sequence to eliminate feedthrough.

Further, feedthrough may be further reduced by implementing each of the first through sixth offset-cancellation switches $S_{OF1}$ through $S_{OF6}$ as a small complementary metal oxide semiconductor (CMOS) switch.

Next, how the multi-stage voltage comparator 200 minimizes the output recovery times of the preamplifiers A21 through A23 to increase its operating speed using the first through sixth reset switches $S_{RS1}$ through $S_{RS6}$ will be described in greater detail.

In order to increase the operating speed of a conventional multi-stage voltage comparator, a structure connecting a switch to an output terminal of each preamplifier and shorting two output nodes prior to operation of each preamplifier has been proposed. This multi-stage voltage comparator can reduce the output recovery time because the output of each preamplifier begins to operate in the proximity of a common mode voltage (CML).

However, in this structure, when a reset time is shorter than a time period in which input signals are crossed, the output recovery time may become long. Further, when the output of the rear stage preamplifier is saturated, the output recovery time becomes very long. This will be described below in greater detail with reference to FIG. 1.

Figure 1:
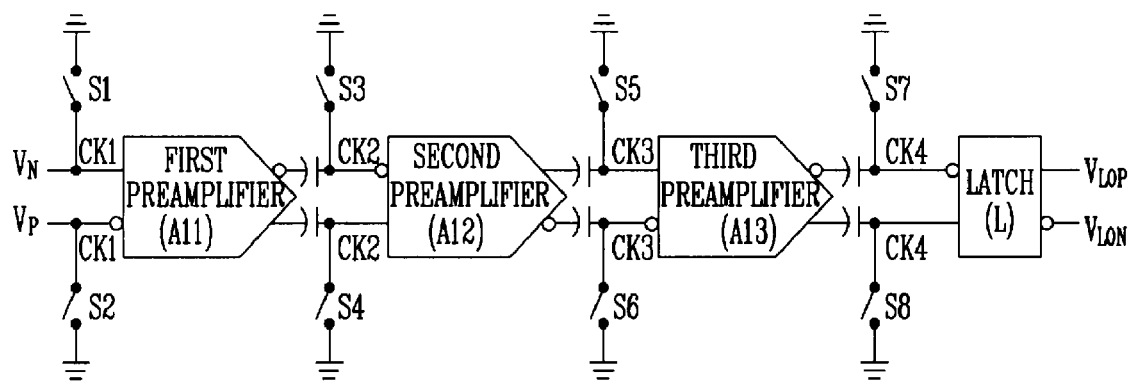
FIG. 1 illustrates a conventional multi-stage voltage comparator used for an analog-to-digital converter (ADC)
Figure 1:
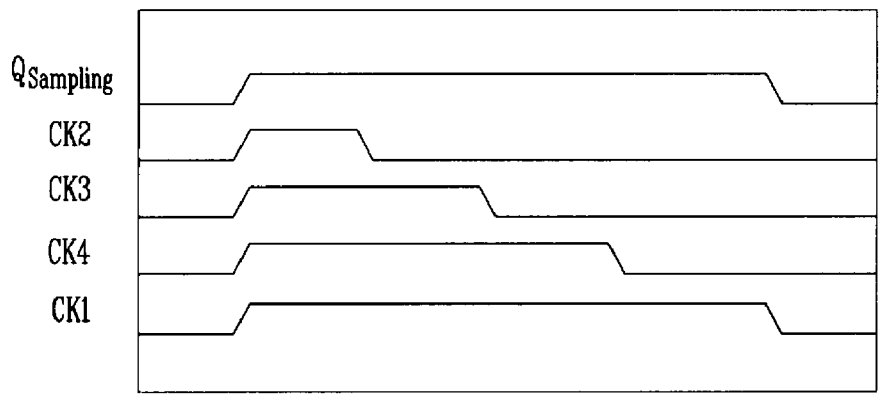

Referring to FIG. 1, when first and second input voltages $V_N$ and $V_P$ are input to the conventional multi-stage voltage comparator 100, the first preamplifier A11 operates before the first and second input voltages $V_N$ and $V_P$ are crossed, amplifies a difference value after the first and second input voltages $V_N$ and $V_P$ are crossed, and outputs a settled value.

Here, the propagation delay time of the first preamplifier A11 is mostly determined by the magnitudes of the crossed input voltages $V_N$ and $V_P$. In particular, when a difference between the crossed input voltages $V_N$ and $V_P$ is large, the multi-stage voltage comparator 100 has a long propagation delay characteristic, so that, strictly speaking, a value of the voltage output from the first preamplifier A11 is not an accurate value of the amplified voltage.

In order to solve this problem, an exemplary embodiment of the present invention is configured so that the first through sixth reset switches $S_{RS1}$ through $S_{RS6}$ are connected to the output terminals of the preamplifiers A21 through A23 to reduce the output recovery time, and so that the clocks CK1, CK3 and CK5 used for the outputs of the preamplifiers A21 through A23 are sequentially operated to have a fast output recovery time even though the output of the rear stage preamplifier is saturated. This will be described below in greater detail.

Figure 4:
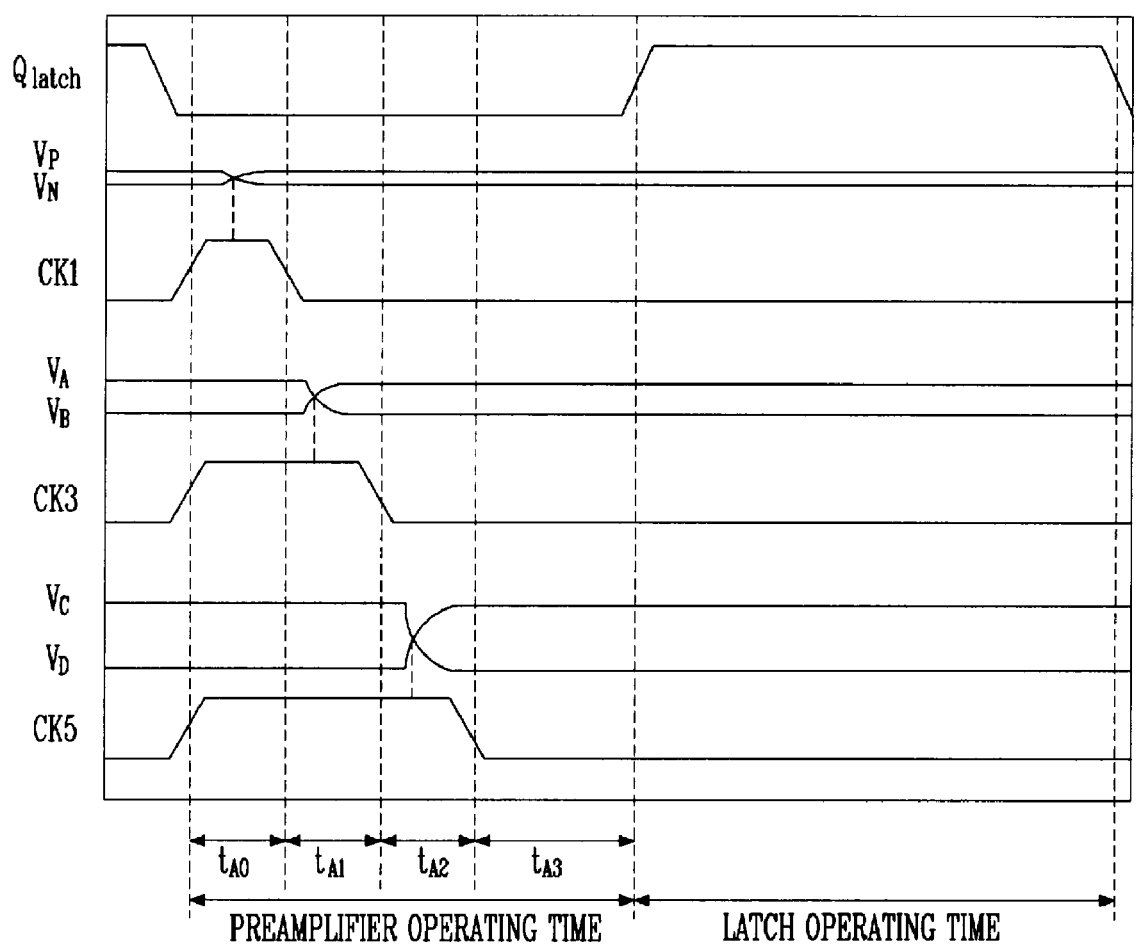
FIG. 4 is an enlarged view of a shaded part of the timing diagram of FIG. 2.

FIG. 4 is an enlarged view of a shaded part of the timing diagram of FIG. 2.

Referring to FIG. 4, when the first and second input voltages $V_N$ and $V_P$ are input to the multi-stage voltage comparator 200, the first and second reset switches $S_{RS1}$ and $S_{RS2}$ maintain an ON state in response to the first clock CK1, and thus the output of the first preamplifier A21 is reset during an initial operating time $t_{40}$.

In other words, the first clock CK1 maintains a HIGH state until after the input voltages $V_N$ and $V_P$ are crossed, thereby serving to reduce the propagation delay time of the first preamplifier A21.

Next, the first preamplifier A21 amplifies a difference between the input voltages $V_N$ and $V_P$ after the input voltages $V_N$ and $V_P$ are crossed during a first operating time $t_{41}$, and outputs first and second output voltages $V_A$ and $V_B$.

Similarly, the third clock CK3 maintains a HIGH state until after the output voltages $V_A$ and $V_B$ of the first preamplifier A21 are crossed, and the fifth clock CK5 maintains a HIGH state until after output voltages $V_C$ and $V_D$ of the second preamplifier A22 are crossed.

Thus, the second preamplifier A22 is reset in response to the third clock CK3 during $t_{40}+t_{41}$, and amplifies a difference between the first and second output voltages $V_A$ and $V_B$ during $t_{42}$. Further, the third preamplifier A23 is reset in response to the fifth clock CK5 during $t_{40}+t_{41}+t_{42}$, and amplifies a difference between the third and fourth output voltages $V_C$ and $V_D$ during $t_{43}$.

In detail, it is actually sufficient only for the first clock CK1 to keep the first preamplifier A21 in reset until the first and second input voltages $V_N$ and $V_P$ are crossed. However, for various reasons, the first clock CK1 may miss the point of time when the first and second input voltages $V_N$ and $V_P$ are crossed in relation to operation of the circuit. Thus, in order to prevent this situation, the second and third preamplifiers A22 and A23 of the following stages are kept in reset until the input voltages are crossed using the third and fifth clocks CK3 and CK5.

Further, when high input voltages are input to the second and third preamplifiers A22 and A23 by the amplification of the first preamplifier A21, the second and third preamplifiers A22 and A23 may be saturated before fifth and sixth input voltages $V_E$ and $V_F$ are input to the latch L. In this case, the output recovery time may become very long. In order to minimize the output recovery time, the second and third preamplifiers A22 and A23 are reset by the third and fifth clocks CK3 and CK5.

In other words, when the first, third and fifth clocks CK1, CK3 and CK5 maintain the HIGH state only until the input voltages input to the respective preamplifiers A21, A22 and A23 are crossed, the output recovery time can be minimized.

Thus, when the multi-stage voltage comparator is designed so that the preamplifier having a relatively fast operating speed is disposed on the front stage, while the preamplifier having a relatively slow operating speed is disposed on the rear stage, the multi-stage voltage comparator has improved overall operating speed compared to the conventional multi-stage voltage comparator using the preamplifiers having the same operating speed.

Meanwhile, though this exemplary embodiment has been described with reference to resetting the outputs of the preamplifiers A21, A22 and A23 using the different three clocks CK1, CK3 and CK5, the outputs of the preamplifiers A21 through A23 may be reset using a single clock if necessary.

Here, when the outputs of the preamplifiers A21 through A23 must be reset using a single clock, it is preferable to use the fifth clock CK5 having the longest cycle. Because it is more important for the preamplifiers A21 through A23 to reduce the propagation delay time of the signal than to catch the point of time when the input voltages are crossed, it is more favorable for the multi-stage voltage comparator 200 to use the fifth clock CK5 having the longest cycle for high-speed operation.

Thus, when a high-speed multi-stage voltage comparator is realized using three preamplifiers, four different clocks are required in the conventional art, as illustrated in FIG. 1, while only one clock is required in the present invention.

As illustrated in FIG. 2, however, the use of three different clocks CK1, CK3 and CK5 is not a serious obstacle, because a recent SAR ADC employs an asynchronous clock scheme that can easily make a multi-phase clock without separately designing a clock circuit.

Figure 5A:
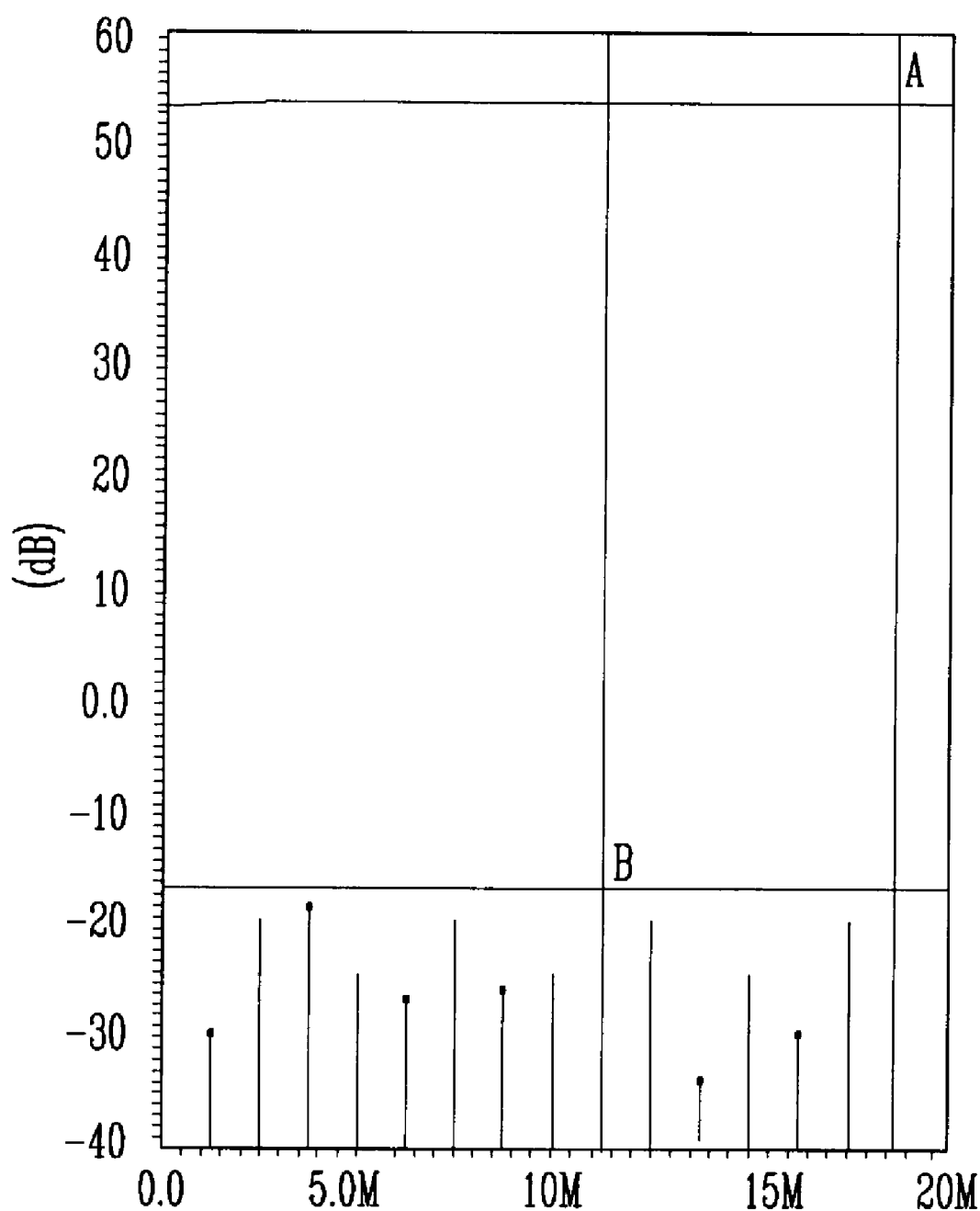
FIGS. 5A and 5B are graphs showing output fast-Fourier-transform (FFT) results of a 10-bit SAR ADC equipped with a multi-stage voltage comparator according to an exemplary embodiment of the present invention and a 10-bit SAR ADC equipped with a conventional multi-stage voltage comparator.
Figure 5B:
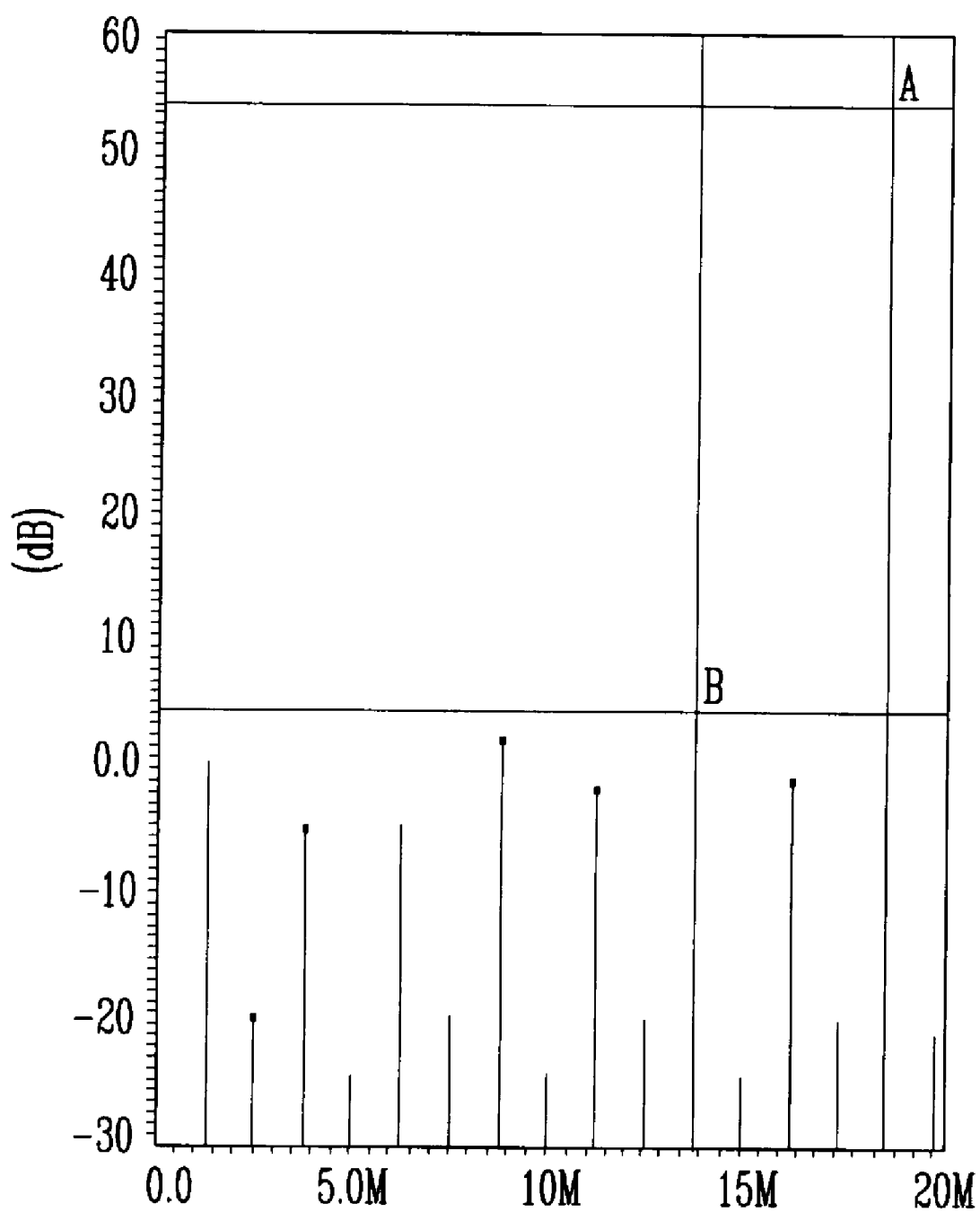

FIGS. 5A and 5B are graphs showing output fast-Fourier-transform (FFT) results of a 10-bit SAR ADC equipped with a multi-stage voltage comparator according to an exemplary embodiment of the present invention and a 10-bit SAR ADC equipped with a conventional multi-stage voltage comparator.

As can be seen from FIGS. 5A and 5B, the 10-bit SAR ADC equipped with the multi-stage voltage comparator according to an exemplary embodiment of the present invention can obtain 10-bit resolution because a dB difference between A and B is 70.4 dB owing to a high operating speed. Whereas the 10-bit SAR ADC equipped with the conventional multi-stage voltage comparator can actually obtain only 8-bit resolution because a dB difference between A and B is 49.8 dB.

According to the present invention, a multi-stage voltage comparator is configured to be able to eliminate the offset from outputs of preamplifiers through respective offset-cancellation switches, and to reset the outputs of the preamplifiers through the respective reset switches to reduce the output recovery time.

Thus, the multi-stage voltage comparator can operate with high accuracy and at a high speed, so that it can be usefully applied to an analog-to-digital converter (ADC), and particularly, a high-speed successive approximation register ADC (SAR ADC).

The drawings and specification disclose typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A high-speed multi-stage voltage comparator, comprising:
    a multi-stage amplifier having a plurality of preamplifiers cascaded on multiple stages;
    a latch connected to an output terminal of the multi-stage amplifier;
    a plurality of capacitors storing voltages output from the respective preamplifiers;
    a plurality of offset-cancellation switches, each offset-cancellation switch being connected between a common node and a second end of a corresponding capacitor among the plurality of capacitors, to eliminate offset from outputs of the respective preamplifiers; and
    a plurality of reset switches, each reset switch being connected between the common node and a first end of a corresponding capacitor among the plurality of capacitors, to reset the outputs of the respective preamplifiers,
    wherein the reset switches reset the outputs of the respective preamplifiers in response to respective clocks maintaining an active state until after input voltages input to the respective preamplifiers are crossed.

2. The high-speed multi-stage voltage comparator of claim 1, wherein the reset and offset-cancellation switches are configured to operate in response to asynchronous clocks.

3. The high-speed multi-stage voltage comparator of claim 1, wherein, before input voltages are input to the respective preamplifiers, the offset-cancellation switches are turned on for a sampling time to eliminate the offset from the outputs of the respective preamplifiers.

4. The high-speed multi-stage voltage comparator of claim 1, wherein, before input voltages are input to the respective preamplifiers, the offset-cancellation switches are sequentially turned on during a predetermined time to eliminate the offset and feedthrough from the outputs of the respective preamplifiers if a sampling time corresponds to a time as long as the comparator has a sufficient speed margin, and wherein the predetermined time is substantially the same as the sampling time.

5. The high-speed multi-stage voltage comparator of claim 1, wherein each of the offset-cancellation switches includes a small complementary metal oxide semiconductor (CMOS) switch.

6. The high-speed multi-stage voltage comparator of claim 1, wherein the respective clocks correspond to a clock having the longest cycle among clocks maintaining an active state until after the input voltages input to the respective preamplifiers are crossed.

7. The high-speed multi-stage voltage comparator of claim 1, wherein, as the reset switches maintain an ON state until after the input voltages input to the respective preamplifiers are crossed, the respective preamplifiers reduce a propagation delay time and an output recovery time.

8. The high-speed multi-stage voltage comparator of claim 7, wherein the respective preamplifiers are reset for a predetermined time by the respective reset switches, and amplify and output a difference between the input voltages after the input voltages are crossed.

9. The high-speed multi-stage voltage comparator of claim 7, wherein the preamplifier at a front stage in the multi-stage amplifier has a higher operating speed than the preamplifier at a rear stage.

10. The high-speed multi-stage voltage comparator of claim 7, wherein, when the preamplifier at a rear stage in the multi-stage amplifier is saturated by amplification of the preamplifier at a front stage, the rear-stage preamplifier is reset for a predetermined time by the reset switch connected to the output terminal thereof, and reduces the output recovery time.

11. The high-speed multi-stage voltage comparator of claim 1, wherein the common node includes a common mode voltage terminal.

12. The high-speed multi-stage voltage comparator of claim 1, wherein the comparator is applied to a successive approximation register analog-to-digital converter.

13. The high-speed multi-stage voltage comparator of claim 1, wherein the sampling time corresponds to a short time ranging from several to tens of nanoseconds.

* * * * *